United States Patent [19]

Miyazaki et al.

[11] Patent Number: 5,798,822
[45] Date of Patent: Aug. 25, 1998

[54] EXPOSURE APPARATUS

[75] Inventors: Seiji Miyazaki; Hiroshi Shirasu, both of Yokohama; Kazuaki Saiki, Tokyo; Tsuyoshi Narabe, Ohmiya, all of Japan

[73] Assignee: Nikon Corporation, Tokyo, Japan

[21] Appl. No.: 950,964

[22] Filed: Oct. 15, 1997

Related U.S. Application Data

[63] Continuation of Ser. No. 544,649, Oct. 18, 1995, abandoned.

[30] Foreign Application Priority Data

Oct. 21, 1994 [JP] Japan .................................. 6-282872

[51] Int. Cl.⁶ .............................. G03G 27/42; G01B 11/00
[52] U.S. Cl. .................... 355/53; 250/491.1; 250/492.2; 355/55; 378/35; 378/206; 378/207; 356/363
[58] Field of Search .................... 250/492.2, 491.1; 378/34, 35, 205–209; 355/50, 53, 55; 356/363, 375, 400, 401

[56] References Cited

U.S. PATENT DOCUMENTS 5,523,574  6/1996  Hamada et al. ................... 250/492.2
5,528,027  6/1996  Mizutani ........................... 250/234

Primary Examiner—R. L. Moses
Attorney, Agent, or Firm—Shapiro and Shapiro

[57] ABSTRACT

A pair of reference plates is so arranged as to have a predetermined positional relationship on a carriage that integrally holds a mask and a photosensitive substrate such that the mask and the photosensitive substrate oppose each other on two sides of a projecting optical system. By periodically detecting the positional relationship between the reference plates in the optical axis direction, a variation with time occurring in the detection characteristics of position detecting devices is detected. Both stable image formation characteristics and a high throughput are realized by correcting a driving signal to be supplied to a driving device in accordance with the detected variation.

19 Claims, 4 Drawing Sheets

EXPOSURE APPARATUS

This is a continuation of application Ser. No. 08/544,649 filed Oct. 18, 1995, now abandoned.

BACKGROUND OF THE INVENTION

1. Field of the Invention

The present invention relates to an exposure apparatus and, more particularly, to an exposure apparatus with an automatic focus adjusting function.

2. Related Background Art

To constantly obtain an optimum resolving power on the image formation surfaces of a mask and a photosensitive substrate, conventional exposure apparatuses have an automatic focus adjusting function, i.e., a function of automatically adjusting the positions of the mask and the photosensitive substrate in the optical axis direction of a projecting optical system. This function stabilizes the image formation performance.

Unfortunately, the detection characteristics of a detector (focus sensor) for measuring the positions of a mask and a photosensitive substrate in the optical axis direction of a projecting optical system generally vary with time, and this degrades the resolving power. Accordingly, it is necessary to periodically measure this variation and thereby remove degradation in the resolving power. The common approach by which this is accomplished is to measure the variation by periodically performing a test exposure and actually observing the pattern formed on a photosensitive substrate with a microscope or like device. However, this method is inefficient since it depends upon man power thus hence requires much labor.

SUMMARY OF THE INVENTION

The present invention has been made in consideration of the above situation and has as one of its objects to provide an exposure apparatus capable of measuring any variation with time of the detection result from a position sensor, and of performing automatic calibration.

To achieve the above object, the present invention provides an exposure apparatus comprising a holding stage for integrally holding a mask and a photosensitive substrate such that the mask and the photosensitive substrate oppose each other on two sides of a projecting optical system, position detecting means for detecting a positional relationship between the mask and the photosensitive substrate in the optical axis direction of the projecting optical system, driving means for driving the mask and/or the photosensitive substrate in the optical axis direction and positioning the mask and the photosensitive substrate to meet a predetermined positional relationship, a pair of reference plates having surfaces arranged on the holding stage to meet the predetermined positional relationship, and control means for detecting a variation occurring in detection characteristics of the position detecting means on the basis of the positional relationship in the optical axis direction of the surfaces of the reference plates detected by the position detecting means, and correcting a driving amount to be given to the driving means on the basis of the detection result.

The control means performs a test exposure in advance and stores the positional relationship between the reference plates detected by the position detecting means and correction values measured by an operator during the test exposure. Thereafter, the control means measures the positional relationship between the reference plates for each exposure or periodically, and compares the measured positional relationship with the positional relationship obtained in advance. In this way, the control means detects a variation with time occurring in the output from the position detecting means and corrects the driving signal to be supplied to the driving means in accordance with the detected variation. Accordingly, the control means can measure and correct a variation with time in the detection characteristics of the position detecting means without repetitively performing the test exposure. This realizes stable image formation characteristics.

DETAILED DESCRIPTION OF THE PREFERRED EMBODIMENT

One embodiment of the present invention will be described below with reference to the accompanying drawings.

Figure 1:
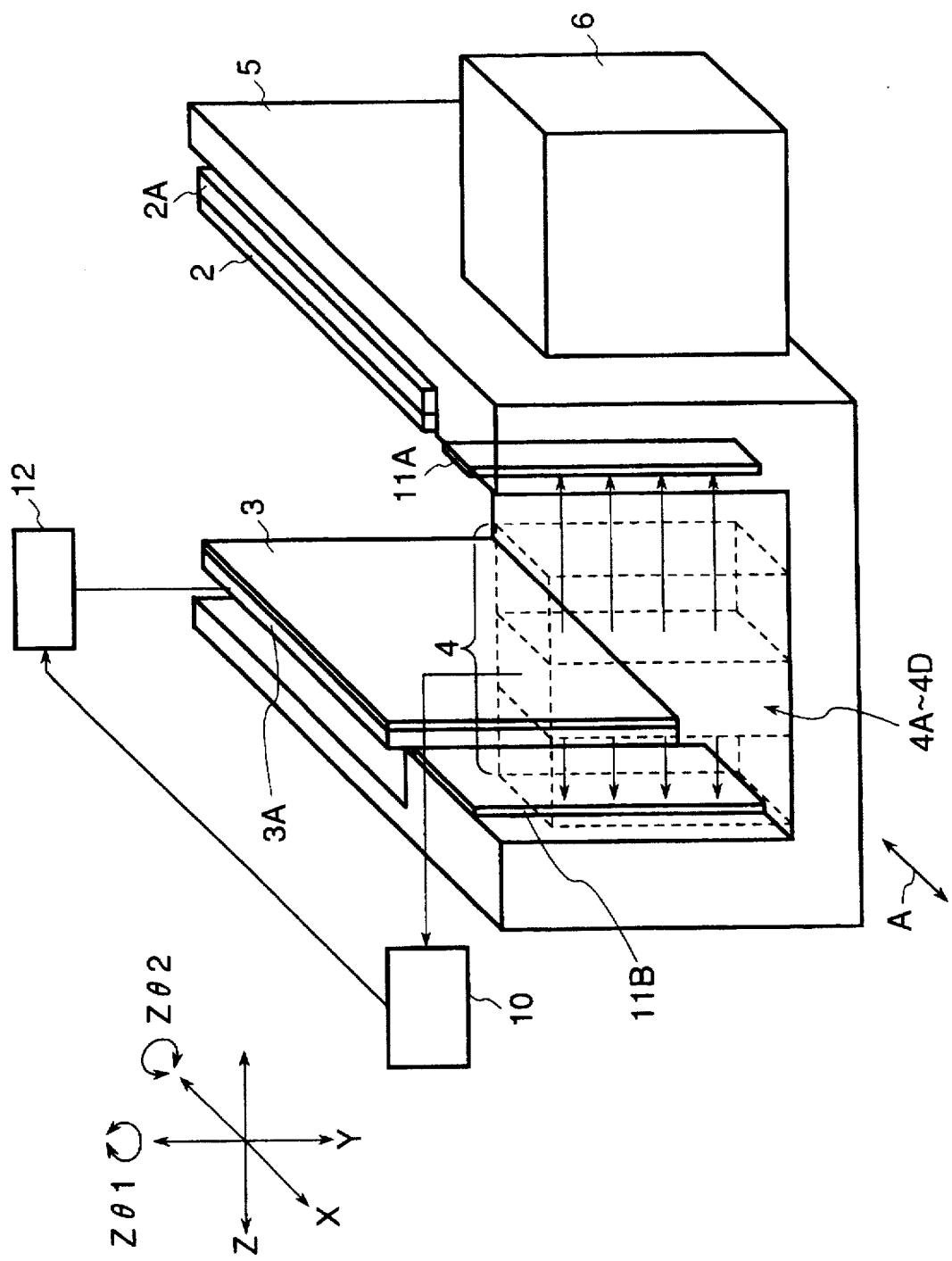
FIG. 1 is a schematic perspective view showing an embodiment of an exposure apparatus according to the present invention.

FIG. 1 shows a scanning exposure apparatus 1 with an automatic focus adjusting function. In this scanning exposure apparatus 1, a carriage 5 holding a mask 2 and a photosensitive substrate 3 is moved as indicated by an arrow A relative to a projecting optical system 4, thereby transferring the entire mask pattern of the mask 2 onto the photosensitive substrate 3. Accordingly, the projecting optical system 4 used in this apparatus is a system which can form an actual-size image of the mask pattern illuminated by an illuminating optical system 6 onto the photosensitive substrate 3.

Figure 2:
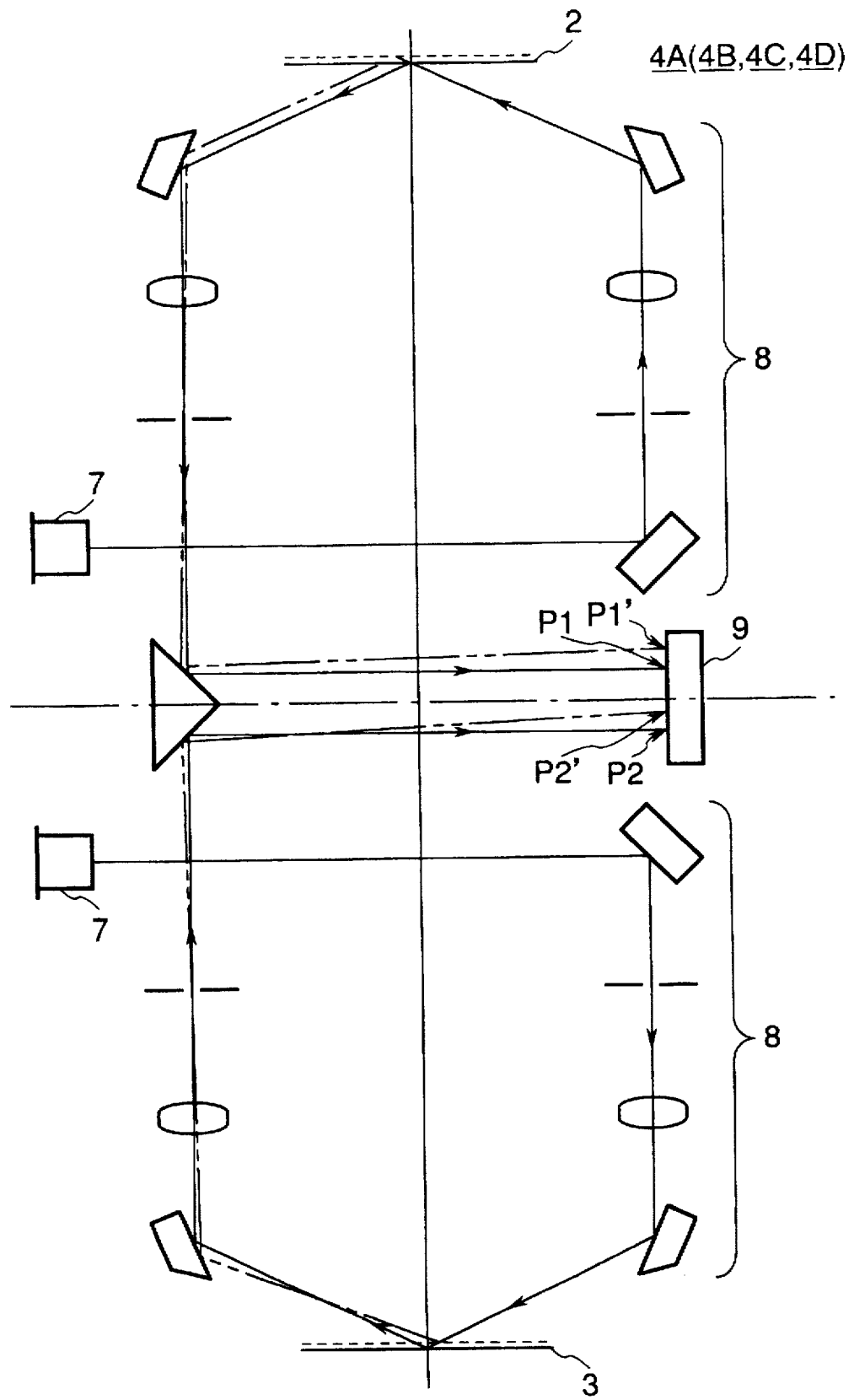
FIG. 2 is a view of optical paths showing the arrangement of a focus sensor.
Figure 3A:
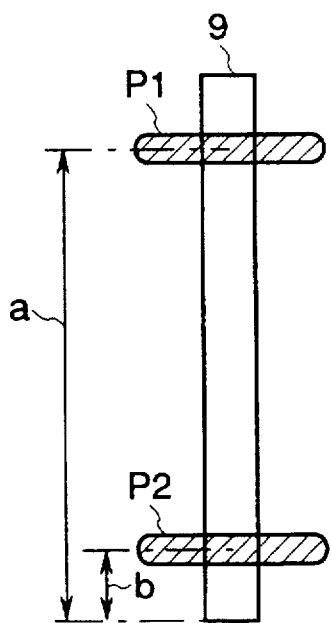
FIGS. 3A and 3B are views showing a slit image measured by a detector and a variation with time of the position of the image, respectively.

The projecting optical system 4 incorporates four focus sensors 4A to 4D each having an arrangement shown in FIG. 2. According to the arrangement in FIG. 2, each of these focus sensors 4A to 4D consists of optical systems 8 and a detector 9 by which illuminating light components emitted from light sources (e.g., LEDs) 7 are shaped into slit-like light components, images of these light components are formed on the detection surfaces (the mask surface and the photosensitive substrate surface), and images of the light components reflected by these detection surfaces are formed on the detector 9. The detector 9 is a one-dimensional CCD or optical position sensor which, as illustrated in FIG. 3A, detects formation positions P1 and P2 of the incident slit images and thereby indirectly detects the positions of the detection surfaces.

From the measurement results from the four focus sensors 4A to 4D, a controller 10 detects the distance between the mask surface and the photosensitive substrate surface and feedback-controls the position of a substrate stage 3A in the optical axis direction, thereby obtaining a positional relationship with which optimum image formation characteristics can be attained. More specifically, the controller 10 controls a driving system 12 which includes three driving mechanisms (a. Z-axis driving mechanism for moving the photosensitive substrate 3 along the optical axis of the projecting optical system 4, a Zθ1 driving mechanism for rotating the photosensitive substrate 3 about a Y axis perpendicular to both of the optical axis and the scanning direction of the projecting optical system 4, and a Zθ2 driving mechanism for rotating the photosensitive substrate 3 about an X axis which is the scanning axis) provided for the substrate stage 3A. The controller 10 so controls the driving system 12 that the height and the inclination of the photosensitive substrate surface are kept constant with respect to the height and the inclination of the mask surface and are conjugate with respect to the projecting optical system 4.

Figure 3B:
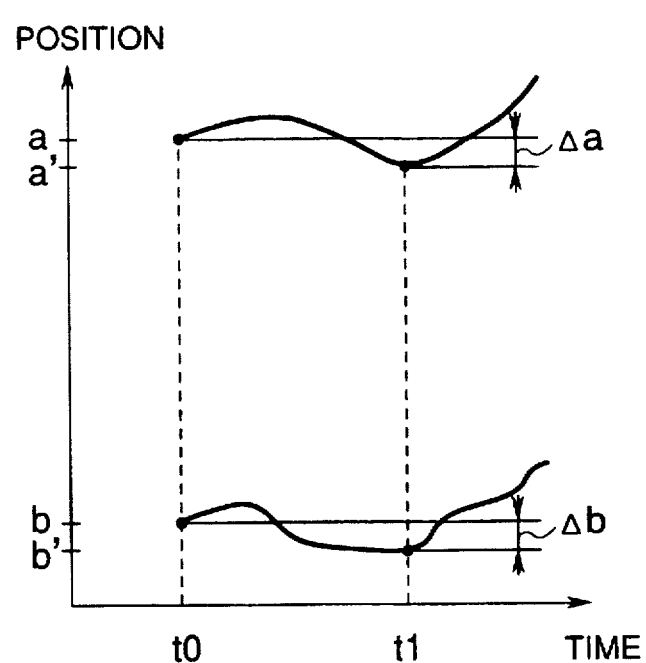

It is to be expected that the measurement results from the focus sensors 4A to 4D will vary with time in accordance with the output from the detector 9 and physical variations in the optical systems 8. In this embodiment, therefore, a pair of opposing plates 11A and 11B are rigidly fixed to the carriage 5, and the absolute positions of these plates 11A and 11B are periodically measured with the focus sensors 4A to 4D. Consequently, variations of the focus sensors 4A to 4D with time can be measured. For example, because the positions of the plates 11A and 11B are fixed at any instant, if variations such as shown in FIG. 3B occur in any of the outputs from the focus sensors 4A to 4D, it is possible to determine that the cause of the variations is in a corresponding one of the focus sensors 4A to 4D.

Automatic calibration performed in the above arrangement by the automatic focus adjusting mechanism using the plates 11A and 11B will be described below. It is assumed the scanning accuracy of the carriage 5 of the scanning exposure apparatus 1 is kept at a high level—more specifically, that an inclination (tilt) from the image formation surface within the scanning range is kept to a very small amount at all times. Measurements and adjustments using, e.g., a laser interferometer can be performed at various angles to accomplish this small inclination.

At initialization (time t0), as illustrated in FIG. 1, the carriage 5 is moved to the measurement position to irradiate illuminating light to the plate 11A on the mask side and the plate 11B on the photosensitive substrate side, thereby forming the respective slit images on the detector 9. The absolute positions of the plates 11A and 11B in the optical axis direction are measured. Note that the reproduction accuracy of the measurement position setting of the carriage 5 when the carriage 5 is moved to the measurement position is kept to be much smaller than, at least, the width of the slit image to be measured. Consequently, it is possible to minimize the influence of the surface accuracy on the formation position of the slit image.

If the positions of the slit images P1 and P2 formed on the detector 9 meet the positional relationship shown in FIG. 3A, the controller 10 individually measures the positions of the slit images P1 and P2 by using either end of the detector 9 as an origin and stores respective absolute positions a and b. In this initialization, therefore, as in conventional systems, a test exposure using the focus sensors 4A to 4D is performed, and correction values of the focus sensors 4A to 4D, which are set on the basis of the observation results of the formed pattern images, are input to the controller 10.

After the initialization as described above, a scanning exposure is started.

When a certain time (time t1) elapses from this initialization, the controller 10 again instructs the focus sensors 4A to 4D to measure the plates 11A and 11B and calculates displacements (or a variation in the distance between the image formation positions a and b) from the image formation positions a and b obtained in the initialization (time t0). If the displacement amounts are 0, the scanning exposure is immediately continued because there is no variation in the outputs of the focus sensors.

On the other hand, if displacements Δa and Δb (or a variation in the distance) occur in the formation positions of the slit images as shown in FIG. 3B, the controller 10 determines that the outputs from the focus sensors 4A to 4D vary. Accordingly, the controller 10 changes the reference positions of the mask surface and the photosensitive substrate surface to image formation positions a' and b' (or changes the reference distance to the distance after the variation).

The controller 10 causes the driving system 12 to drive the substrate stage 3A such that the distance between the mask surface and the photosensitive substrate surface is kept constant on the basis of the newly obtained image formation positions a' and b' (or the distance after the variation), thereby continuing the scanning exposure. Consequently, it is possible to suppress degradation of the image formation characteristics resulting from variations with time in the detection characteristics of the focus sensors 4A to 4D. Also, repeating the test exposure, such as in conventional systems, is unnecessary, so the scanning exposure can be continued without reducing the throughput.

In conventional systems, even if the outputs from the focus sensors 4A to 4D vary, the positions of the mask surface and the photosensitive substrate surface during the scanning exposure continue to be detected as displacements from the image formation positions a and b obtained at time t0. Consequently, degradation in the image formation characteristics due to the variations Δa and Δb occurs.

In the above arrangement, the plates 11A and 11B, having a distance between them which does not vary with time, are attached to the carriage 5. Variations with time occurring in the output characteristics of the focus sensors 4A to 4D are measured by periodically measuring the distance between the plates 11A and 11B. Accordingly, the control amount to be given to the substrate stage 3A can be automatically corrected. This can realize a scanning exposure apparatus capable of maintaining a prescribed focusing accuracy without reducing the throughput.

In the above embodiment, the driving system 12 consisting of the Z, Zθ1, and Zθ2 driving mechanisms is provided only for the substrate stage 3A in consideration of the facts that the flatness of the mask 2 is high and the influence of distortion or inclination is small due to vertical holding. However, the present invention is not limited to the above embodiment. For example, this driving system can be provided for a mask stage 2A, or two such driving systems can be provided for both the mask stage 2A and the substrate stage 3A.

Figure 4:
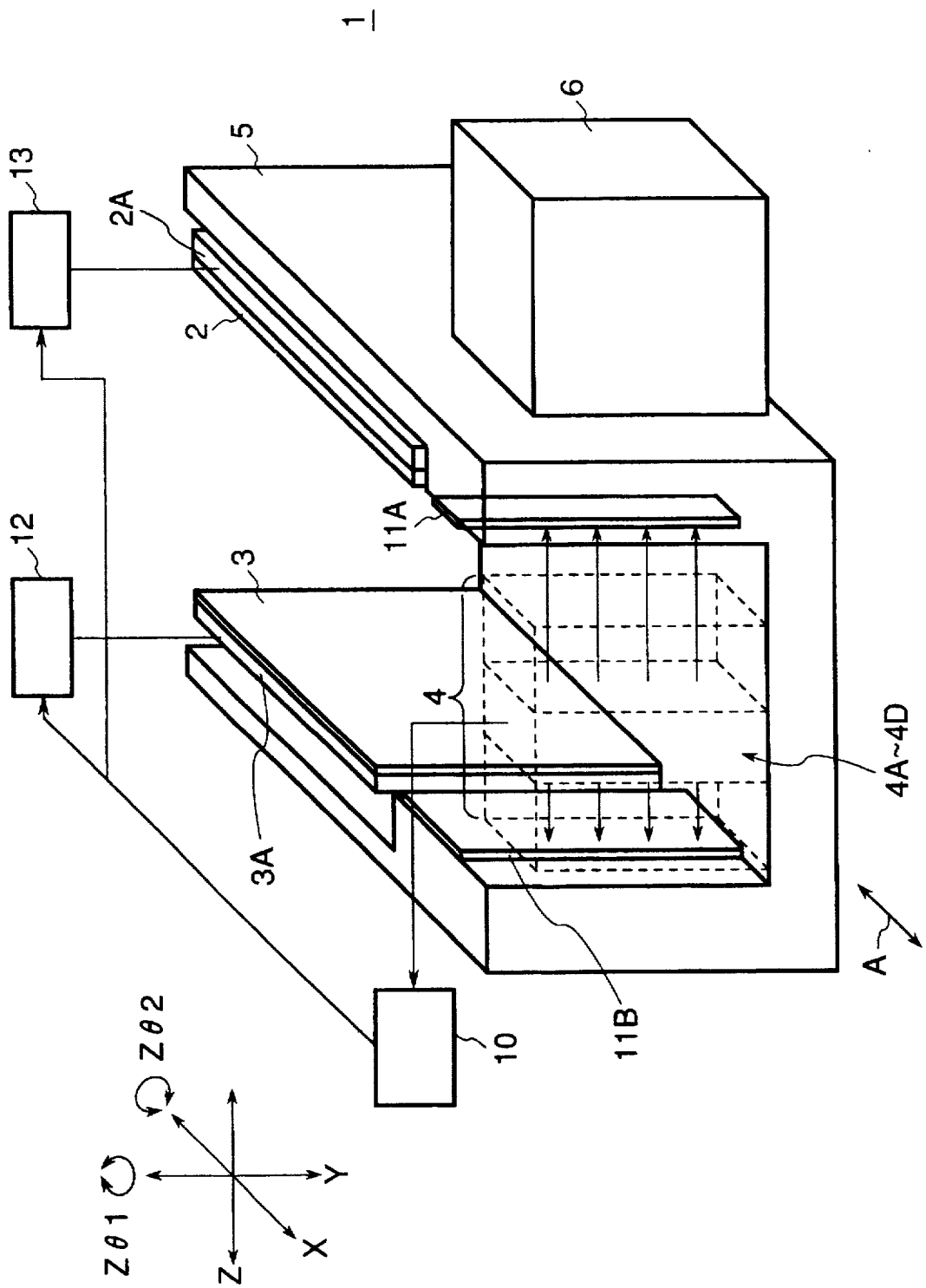
FIG. 4 is a perspective view showing a modification of the apparatus in FIG. 1.

FIG. 4 illustrates an apparatus which also includes a driving system 13 for driving the mask stage 2A. The modification shown in FIG. 4 is identical with the embodiment shown in FIG. 1 except for this driving system 13. Therefore, the same reference numerals as in the above embodiment denote the same parts in this modification, and a detailed description thereof will be omitted.

In the above embodiments, the distance between the plates 11A and 11B is periodically measured. However, this measurement can be performed each time the photosensitive substrate is exchanged or a cassette containing the photosensitive substrate is exchanged. Alternatively, the measurement can be performed whenever a designated number of objects have been exposed or a designated time is reached.

The above embodiments also use a one-to-one magnification system as the projecting optical system 4. However, the present invention is not limited to such application and is similarly applicable to a reducing optical system.

Furthermore, in the above embodiments, the present invention is applied to a scanning exposure apparatus. However, the present invention is not restricted to such application and can be similarly applied to a so-called stepper.

According to the present invention as described above, it is possible to readily realize an exposure apparatus capable of detecting variations with time in the detection characteristics of position detecting means by periodically detecting the positional relationship in the optical axis direction between a pair of reference plates arranged on a carriage, and correcting a driving signal to be supplied to driving means in accordance with the detected variations, thereby achieving both stable image formation characteristics and a high throughput.

What is claimed is:

1. An exposure apparatus comprising:

a projecting optical system;

a holding stage which holds a mask and a photosensitive substrate such that said mask and said photosensitive substrate are opposed to each other with said projecting optical system between, an image of said mask being projected onto said photosensitive substrate by said projecting optical system; a position detecting device which detects a positional relationship between said mask and said photosensitive substrate in an optical axis direction of said projecting optical system;

a driving device which drives said mask and/or said photosensitive substrate in the optical axis direction and relatively positions said mask and said photosensitive substrate to meet a predetermined positional relationship;

a pair of reference plates arranged on said holding stage and opposed each other along the optical axis direction; and a control device which causes said position detecting device to detect a positional relationship of said reference plates, in the optical axis direction, and which corrects said position detecting device based on the detected positional relationship of said reference plates.

2. An apparatus according to claim 1, wherein said projecting optical system is an optical system of one-to-one magnification.

3. An apparatus according to claim 1, wherein said holding stage is moved relative to said projecting optical system, and an entire surface of said mask is exposed onto said photosensitive substrate by the relative movement.

4. An apparatus according to claim 3, further comprising at least one of a mask stage on which said mask is placed to be movable with respect to said holding stage and a substrate stage on which said photosensitive substrate is placed to be movable with respect to said holding stage, wherein said driving device adjusts the positional relationship between said mask and said photosensitive substrate by controlling at least one of said mask stage and said substrate stage.

5. An apparatus according to claim 1, wherein said holding stage holds said mask and said substrate along a vertical direction.

6. An apparatus according to claim 1, wherein said control device causes said position detecting device to detect a positional relationship of said pair of reference plates in the optical axis direction at a predetermined time interval.

7. An exposure apparatus comprising:

a projecting optical system disposed between a mask formed with a pattern and a photosensitive substrate, which projects an image of the pattern of said mask onto said photosensitive substrate;

a position detecting device which detects a positional relationship between said mask and said photosensitive a substrate in an optical axis direction of said projecting optical system;

a pair of reference plates arranged in accordance with a predetermined positional relationship, in said optical axis direction, of said mask and said photosensitive substrate; and a calibration device which calibrates said position detecting device using said reference plates.

8. An apparatus according to claim 7, further comprising:

a holding member which integrally holds said mask and said photosensitive substrate, wherein said reference plates are provided on said holding member.

9. An apparatus according to claim 7, wherein said mask and said substrate are moved synchronously with respect to said projecting optical system.

10. An apparatus according to claim 7, wherein said position detecting device is disposed in the vicinity of said projecting optical system.

11. An apparatus according to claim 7, wherein said calibration device detects a positional relationship of said pair of reference plates in said optical axis direction, and calibrates said position detecting device when the detected positional relationship deviates from the predetermined positional relationship.

12. An exposure method for exposing a pattern of a mask onto a substrate through a projection optical system, comprising the steps of:

detecting a distance, in a direction of an optical axis of the projection optical system, between a pair of reference plates which are arranged at spaced positions in the optical axis direction, of said mask and said substrate; and adjusting a distance in the optical axis direction between said mask and said substrate based on a result of said detection.

13. An exposure method according to claim 12, wherein when a detection result obtained in said detecting step differs from a previous detection result, the adjustment of the distance between said mask and said substrate in said adjusting step is effected based on the difference in the detection result.

14. An exposure method according to claim 12, wherein said adjusting step includes a step of detecting positions of said mask and said substrate in said optical axis direction with a sensor, and comparing a result of this detection and the detection result with respect to said pair of reference plates.

15. An exposure method according to claim 12, wherein said step of detecting the distance between said pair of reference plates includes synchronously moving said pair of reference plates.

16. An exposure method according to claim 12, wherein said step of detecting the distance between said pair of reference plates is performed at predetermined time intervals.

17. An exposure method according to claim 12, wherein said step of detecting the distance between said pair of reference plates is performed after a plurality of exposures of said substrate are effected.

18. An exposure method according to claim 12, wherein said step of detecting the distance between said pair of reference plates is performed after each occurrence of a predetermined number of exposures of said substrate.

19. A substrate having a pattern formed by an exposure method according to claim 12.

* * * * *